US005640351A

United States Patent [19]
Yabe et al.

[11] Patent Number: 5,640,351
[45] Date of Patent: Jun. 17, 1997

[54] SEMICONDUCTOR MEMORY CIRCUIT HAVING DATA BUSES COMMON TO A PLURALITY OF MEMORY CELL ARRAYS

[75] Inventors: Tomoaki Yabe, Kawasaki; Shinji Miyano; Katsuhiko Sato, both of Yokohama; Kenji Numata, Yamato, all of Japan

[73] Assignee: Kabushiki Kaisha Toshiba, Kawasaki, Japan

[21] Appl. No.: 601,859

[22] Filed: Feb. 15, 1996

[30] Foreign Application Priority Data

Feb. 17, 1995 [JP] Japan ..................... 7-029571

[51] Int. Cl.⁶ ........................................... G11C 8/00
[52] U.S. Cl. .................. 365/189.04; 365/189.05; 365/230.06; 365/230.08
[58] Field of Search ................ 365/230.06, 230.08, 365/189.05, 189.04

[56] References Cited

U.S. PATENT DOCUMENTS

| 5,392,242 | 2/1995 | Koike | 365/230.06 |
| 5,428,573 | 6/1995 | Watanabe | 365/230.06 |
| 5,499,218 | 3/1996 | Ahn et al. | 365/230.06 |

*Primary Examiner*—Son T. Dinh
*Attorney, Agent, or Firm*—Banner & Witcoff, Ltd.

[57] ABSTRACT

According to the present invention, a data bus common to a plurality of memory cell arrays is formed by selecting a column so as to prevent a data collision from occurring. Specifically, two memory cell arrays have each of data buses in common. A column decoder is supplied with a control signal to control a column selection logic circuit. The column selection logic circuit is so controlled that the data read out to the data buses in response to the control signal is prevented from colliding with each other during the simultaneous access to the two cell arrays.

16 Claims, 10 Drawing Sheets

SEMICONDUCTOR MEMORY CIRCUIT HAVING DATA BUSES COMMON TO A PLURALITY OF MEMORY CELL ARRAYS

BACKGROUND OF THE INVENTION

1. Field of the Invention

The present invention relates to the architecture of a semiconductor memory system and, more particularly, to a semiconductor memory circuit applied to a DRAM for outputting multiple-bit data.

2. Description of the Related Art

A DRAM with a data latch is capable of high-speed access when it outputs specified data together. The data latch is provided between a column selection gate and a sense amplifier of a memory cell and so is a transfer gate. If cell data read out of a memory cell array is transferred to the data latch through the transfer gate and then the transfer gate is turned off, data transfer between the data latch and data bus DQ connected to an output buffer through the column selection gate can be performed independently of an operation of the memory cell array.

The above circuit arrangement allows the following advantageous operation to be performed. During the sequence readout of data from the data latch, the next new data corresponding to a row (word line) is read out of a selected memory cell of the memory cell array and latched in advance in the sense amplifier. When the need arises, the transfer gate is turned on to transfer the latched data to the data latch. Thus, the time required for reading data out of a memory cell, which is usually about 60 ns, can be regarded as if it were not taken on the data bus DQ, and new row data can be read out after a lapse of a time period which is shorter than 10 ns necessary for data transfer from the sense amplifier to the data latch.

Figure 1:
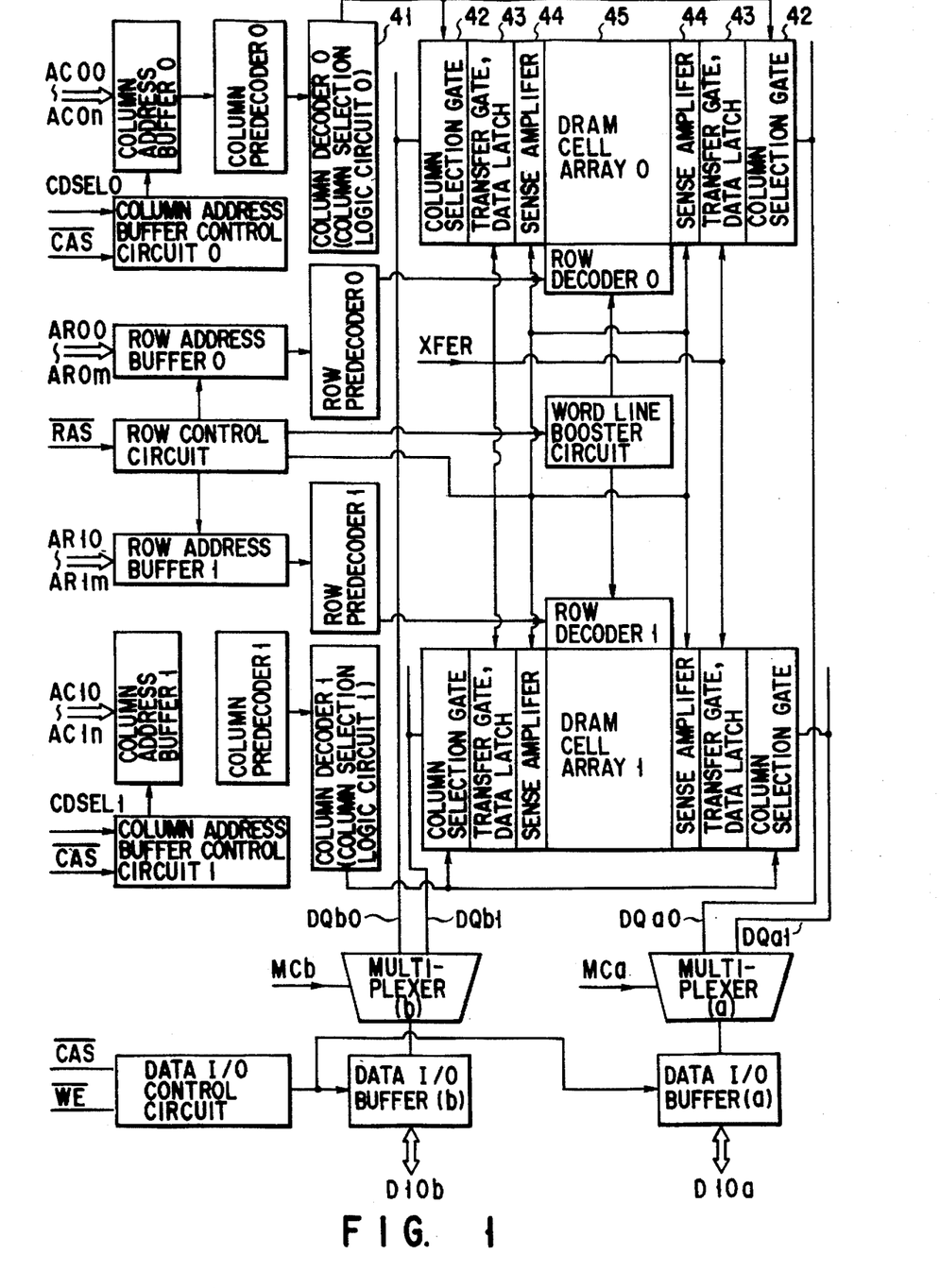
FIG. 1 is a block diagram showing the circuit arrangement of a conventional DRAM having a data latch function.

FIG. 1 is a block diagram showing a memory circuit including a DRAM with a data latch function, which is disclosed in Japanese Patent Application No. 6-74549 and based on which the present invention has been developed. Referring to FIG. 1, the memory circuit includes two DRAM cell arrays 0 and 1, and these cell arrays receive different row and column address signals to select a row (word line) and a column (bit line). More specifically, assuming that n=1, 2, 3, . . . and m=1, 2, 3, . . . (n, m=positive integer), the cell array 0 selects a column by means of a column decoder 0 and a column selection logic circuit 0 upon receiving (n+1)-bit column address signals AC00 to AC0n and selects a row upon receiving (m+1)-bit row address signals AR00 to AR0m. Similarly, the cell array 1 selects a column and a row upon receiving (n+1)-bit column address signals AC10 to AC1n and (m+1)-bit row address signals AR10 to AR1m, respectively.

The input row address signals AR00 to AR0m and AR10 to AR1m are latched at the falling edge of a $\overline{RAS}$ (row address strobe, indicates inversion) signal and supplied to row decoders 0 and 1 via row address buffers 0 and 1 and row predecoders 0 and 1 to activate a word line selected by the cell array 0 and a word line selected by the cell array 1, respectively.

The column address signals AC00 to AC0n and AC10 to AC1n are latched at the falling edge of a $\overline{CAS}$ (column address strobe, indicates inversion) signal and supplied through column address buffers 0 and 1, column predecoders 0 and 1, column decoders 0 and 1 and column selection logic circuits 0 and 1 to select a column corresponding to the cell array 0 and column corresponding to the cell array 1, respectively. The column address buffers 0 and 1 are activated when input column decoder selection signals CDSEL0 and CDSEL1 are at a high level. For example, when the signal CDSEL0 is high and the signal CDSEL1 is low, the column address buffer 0 is activated and the column address buffer 1 is deactivated. Thus, only a column corresponding to the cell array 0 is selected in response to the input column address signal.

Figure 2:
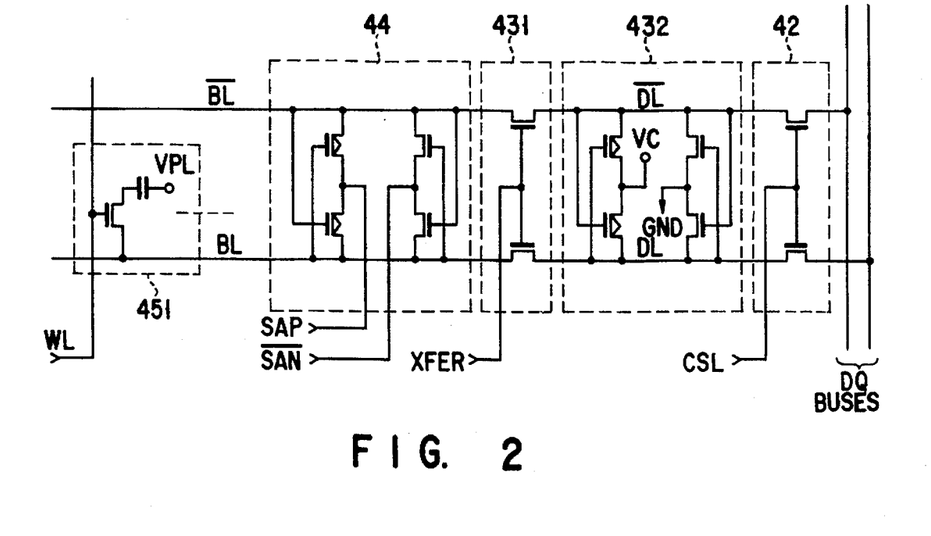
FIG. 2 is a first circuit diagram showing in detail part of the DRAM of FIG. 1.

FIG. 2 is a circuit diagram showing the main part of the memory circuit shown in FIG. 1, that is, the arrangement between the data bus DQ and cell array. The circuit includes a sense amplifier 44 for sensing the potentials of a bit line BL connected to a memory cell 451 ($V_{PL}$ is reference potential of plate electrode) of the cell array 0 and its complementary bit line $\overline{BL}$. The sense amplifier 44 includes two CMOS inverters each of which is so constituted that the input of a first CMOS inverter is connected to the output of a second CMOS inverter and the output of the former is connected to the input of the latter and these inputs and outputs are connected between the bit lines BL and $\overline{BL}$. In FIG. 2, SAP and $\overline{SAN}$ represent sense amplifier activation signals which are complementary to each other and serve as power supplies for operating the two CMOS inverters. While the signal SAP serves as a high-potential power supply in the P-channel MOS transistor, the signal $\overline{SAN}$ serves as a low-potential power supply (e.g., ground potential) in the N-channel MOS transistor.

A transfer gate 431 is provided halfway through the bit lines BL and $\overline{BL}$ to serve as a transfer switch and is controlled by an input transfer gate control signal XFER. A data latch 432 latches bit-line data transmitted from the transfer gate 431. The data latch also includes two CMOS inverters each of which is so constituted that the input of a first CMOS inverter is connected to the output of a second CMOS inverter and the output of the former is connected to the input of the latter and these inputs and outputs are connected between data lines DL and $\overline{DL}$. To carry out the latch operation, the operating power supplies of the two CMOS inverters are connected to a high potential VC in the P-channel MOS transistors and a low potential (e.g., ground potential GND) in the N-channel MOS transistors. A column selection gate 42 is also a transfer switch for controlling the transfer of data between the data buses DQ and data lines DL and $\overline{DL}$ and in response to a column selection signal CSL.

Figure 3A:
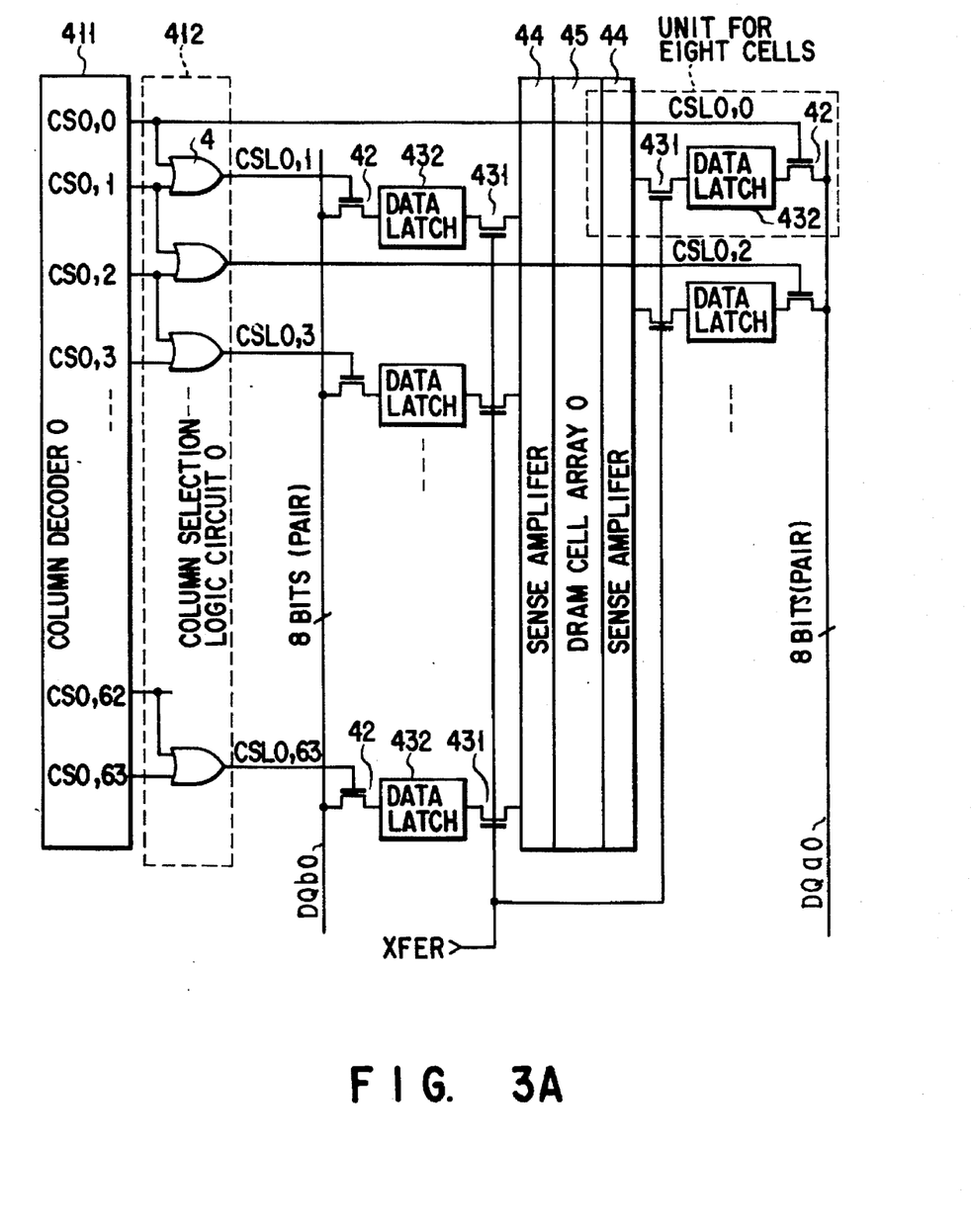
FIG. 3A is a second circuit diagram showing the main part of the conventional DRAM of FIG. 1.
Figure 3B:
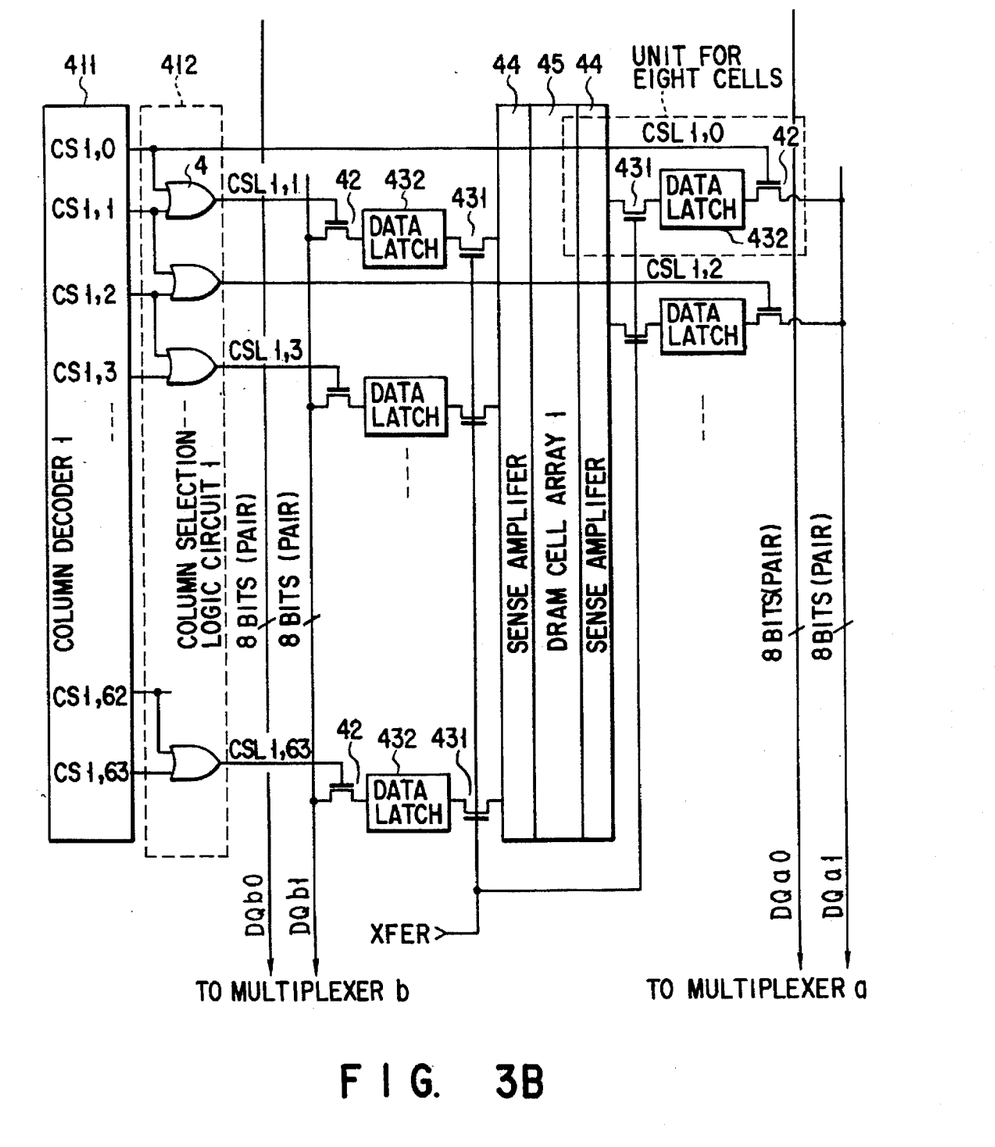
FIG. 3B is a third circuit diagram showing the main part of the conventional DRAM of FIG. 1.

FIGS. 3A and 3B are circuit diagrams of the main part of the memory circuit shown in FIG. 1 which includes the arrangement of the column selection gate, column decoder and column selection logic circuit. In FIG. 3A, the columns constituting the cell array 0 are divided into odd-numbered address columns and even-numbered address columns. The former columns have a sense amplifier 44, a transfer gate 431, a data latch 432 and a column selection gate 42 on the left side of the cell array 0 and are connected to the data bus DQb0, while the latter columns have a sense amplifier 44, a transfer gate 431, a data latch 432 and a column selection gate 42 on the right side thereof and are connected to the data bus DQa0. This circuit arrangement is the same as that of the cell array 1 and, in this case, the odd-numbered address columns are connected to the data bus DQb1 and the even-numbered columns are connected to the data bus DQa1 (see FIG. 3B).

The above columns include sixty-four address decode columns numbered from 0 to 63, which means that n=5 and 6-bit column address signals are input to the circuit shown in FIG. 1. Though not shown, eight pairs of columns (i.e., sixteen columns) are connected to, e.g., a single column selection signal CSL0,0, and these columns are connected to the 8-bit data buses DQ. In FIG. 3A, the transfer gate 431, data latch 432 and column selection gate 42, which are encircled with the broken line, constitute a data transmission unit for eight cells, that is, a circuit block corresponding to eight arrangements of FIG. 2, and eight pairs of columns (i.e., sixteen columns) are connected to the 8-bit data buses DQa0. This arrangement is true of FIG. 3B, and eight pairs of columns (i.e., sixteen columns) are connected to the 8-bit data buses DQa1.

A column decoder and a column selection logic circuit will now be described with reference to FIG. 3A. The column decoder 0, indicated by reference numeral 411, generates sixty-four column decode signals CS0,0 to CS0,63 upon reception of 6-bit address signals AC00 to AC05. These column decode signals are input to OR gates 4 of the column selection logic circuit, denoted by numeral 412, and the outputs thereof are supplied to the column selection gates as column selection signals CSL0,0 to CSL0,63. Thus, two adjacent columns are selected simultaneously when a specified column address signal is input.

For example, two column selection signals CSL0,1 and CSL0,2 are activated in response to an address signal corresponding to the column decode signal CS0,1. Generally, when an address signal corresponding to the i-th column decode signal is input, the i-th and the (i+1)-th column selection signals are activated, and data of eight pairs of columns corresponding to the column selection signals is read out from the data latches 432 to the data buses DQa0 (even-numbered columns of the i-th and (i+1)-th columns) and DQb0 (odd-numbered columns thereof).

The above-described column selection logic circuit is advantageously applied to a memory for storing image data having a function of making an address space correspond to the pixel array of one screen and simultaneously reading data of adjacent addresses corresponding to adjacent pixels of the pixel array. For example, it is applied to the motion compensation of a dynamic image compression device. Using the column selection logic circuit, such a special function can be easily carried out.

Figure 4:
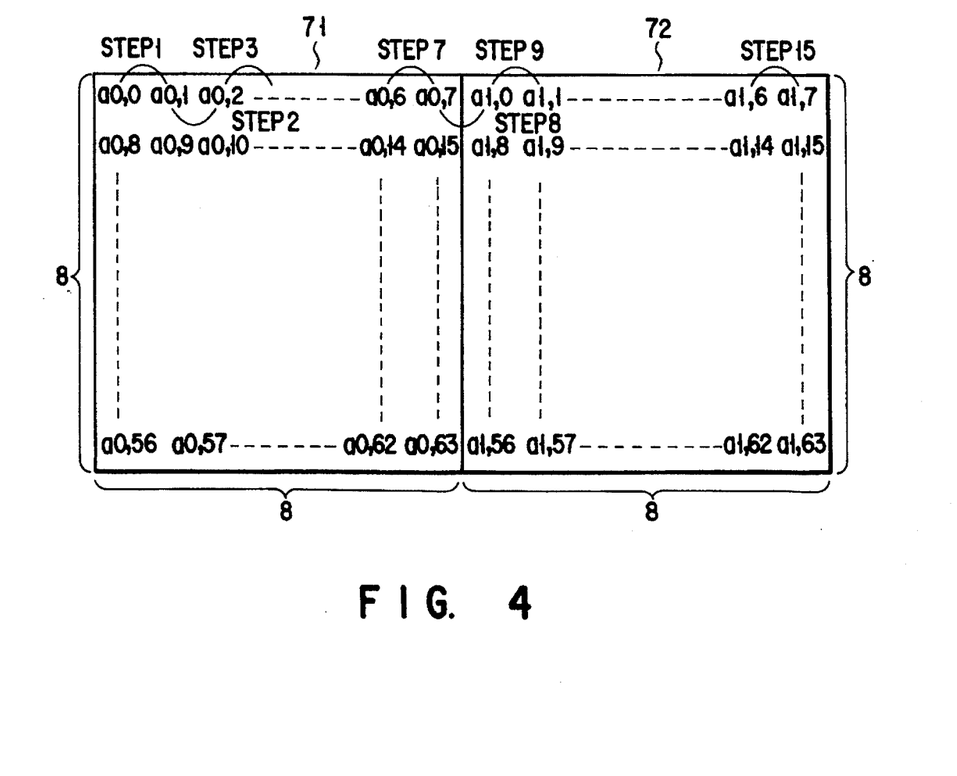
FIG. 4 is a conceptual view showing a screen constituted of pixels to which an address space is applied.

FIG. 4 is a conceptual view showing a screen constituted of pixels to which a column address space is applied. For easy understanding, it is assumed that the screen is constituted of 128 (=8×8×2) pixels and the column address space of the DRAM shown in FIGS. 3A and 3B is applied to such a screen. In this screen, while a0,0 to a0,63 indicate the column addresses (corresponding to AC00 to AC05) of the cell array 0, a1,0 to a1,63 represent those (corresponding to AC10 to AC15) of the cell array 1.

As illustrated in FIG. 4, the address space corresponding to one screen is achieved by forming a column address space 71 of the cell array 0 and a column address space 72 of the cell array 1 adjacent to each other. Since 8-bit data corresponds to each of the column addresses, 8-bit color information of each pixel can be applied to each column address.

Let us consider that in the screen shown in FIG. 4 the uppermost horizontal line from a0,0 to a1,7 is scanned from left to right while accessing two adjacent column addresses simultaneously. The scanning is executed according to the first to fifteenth steps as follows: a0,0 and a0,1 in STEP 1, a0,1 and a0,2 in STEP 2, ..., and a1,6 and a1,7 in STEP 15.

An operation of the DRAM shown in FIG. 1 in the above scanning, will be described with reference to the timing chart of FIG. 5. Prior to scanning of the screen, row address signals AR00 to AR0m and AR10 to AR1m are latched at the falling edge of a $\overline{RAS}$ signal and two word lines WL corresponding thereto are activated by their respective cell arrays 0 and 1. When the word lines are activated, cell data of corresponding rows are read out to bit lines BL and $\overline{BL}$ and latched by the sense amplifiers with the sense amplifier activation signals SAP and $\overline{SAN}$ active. After that, the transfer gate control signal XFER is activated, and the latched data are transferred to the data lines DL and $\overline{DL}$ serving a pair of nodes for holding the data latched.

Figure 5:
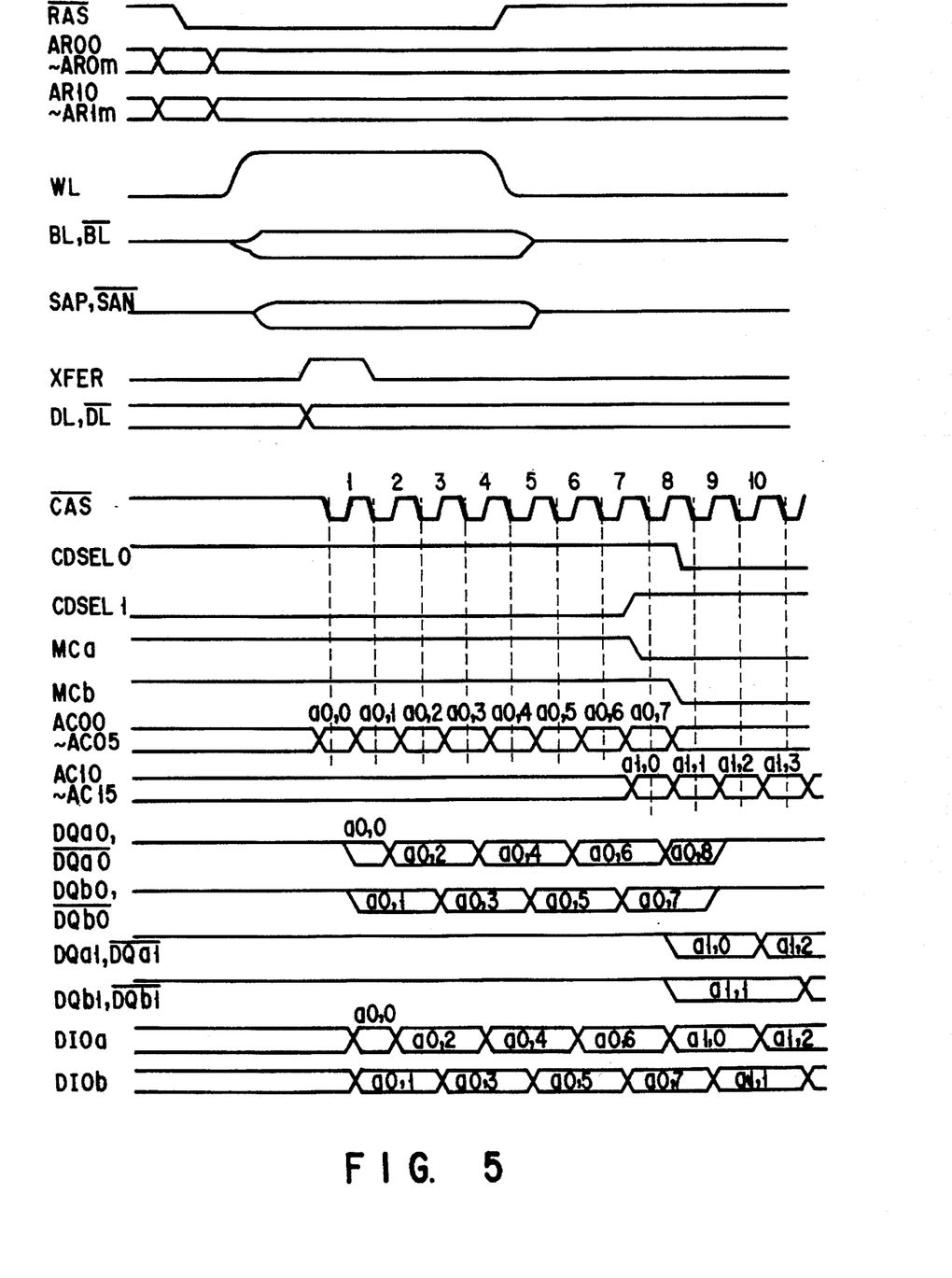
FIG. 5 is a timing chart of the circuit operation of the conventional DRAM shown in FIG. 1.

According to FIG. 5, when the column address a0,0 is latched at the falling edge of a $\overline{CAS}$ signal, columns corresponding to the column addresses a0,0 and a0,1 are selected by the column selection logic circuit 0 and data corresponding to the column addresses are read out to the data buses DQa0 and DQb0, respectively. The cell array 0 has only to be accessed and the cell array 1 need not be done. Therefore, only the signal CDSEL0 is set to a high level and the signal CDSEL1 is set to a low level. The data buses DQa0 and DQb0 are selected by multiplexers (a) and (b) in FIG. 1 and their data are output as DIOa and DIOb through data I/O buffers (a) and (b) (STEP 1).

The multiplexer (a) selects DQa0 when a multiplexer controlled input signal MCa is at a high level and selects DQa1 when the signal MCa is at a low level. The multiplexer (b) selects DQb0 when a multiplexer controlled input signal MCb is at a high level and selects DQb1 when the signal MCb is at a low level. In STEP 1, therefore, the signals MCa and MCb are both at a high level.

If the column address a0,1 is latched at the falling edge of the $\overline{CAS}$ signal, data corresponding to the column addresses a0,1 and a0,2 are read out to the data buses DQb0 and DQa0 and output as DIOa and DIOb through the multiplexers (a) and (b) (STEP 2).

As described above, from STEP 1 to STEP 7, two pairs of data are read out from the data latch of the cell array 0 for each of the STEPS. It is STEP 8 that we are to notice. In STEP 8, data corresponding to the column addresses a0,7 and a1,0 in FIG. 4 are read out, but the former should be read out from the data latch of the cell array 0 and the latter should be read out from the data latch of the cell array 1. Therefore, in this step, the two cell arrays can be accessed by setting both the signals CDSEL0 and CDSEL1 high, and the address signals AC00 to AC05 and AC10 to AC15 are input such that the former correspond to the column address a0,7 and the latter correspond to the column address a1,0. Then, data corresponding to the column addresses a0,8, a0,7, a1,0 and a1,1 are read out to the data buses DQa0, DQb0, DQa1 and DQb1. The multiplexer controlled input signals MCa and MCb are set to low and high levels, respectively, thereby selecting the column addresses a0,7 and a1,0 and outputting them as DIOa and DIOb (STEP 8).

From STEP 9 to STEP 15, the signals CDSEL0 and CDSEL1 are set to low and high levels, respectively, thereby to read out two pairs of data from the cell array 1. In these steps, both the signals MCa and MCb are set to a low level.

The above-described DRAM with a latch includes different data buses DQ (DQa0, DQb0, DQa1, DQb1) corresponding to the cell arrays 0 and 1 and each of the data buses has a pair of 8-bit complementary signal wirings. Therefore, the area for the data buses is so increased that high degree of integration cannot be achieved, with the result that a chip can be prevented from reducing in size.

SUMMARY OF THE INVENTION

It is therefore an object of the present invention to provide a semiconductor memory circuit capable of decreasing a chip in size by improving the architecture of a conventional DRAM so as to reduce in bus area.

To attain the above object, there is provided a semiconductor memory circuit comprising:

L (L≧2) memory cell arrays each including memory cells of M rows and N columns formed in matrix, the N columns having bit lines and being divided into P groups of columns (2≦P≦L);

column selection gates each having a conductive path one end of which is connected to each of the bit lines;

data buses common to the L memory cell arrays, each of the data buses being connected to another end of the conductive path of each of the column selection gates; and column selection means for controlling the column selection gates in such a manner that data are read out of/written to P groups of data buses corresponding to the P groups of columns through the column selection gates corresponding to Q (1≦Q≦N) bit lines corresponding to arbitrary memory cells included in the N columns of one of the L memory cell arrays, and for allowing simultaneous access to the memory cell arrays in each of the P groups of data buses.

According to the present invention, a plurality of memory cell arrays have data buses in common, and the column selection means is controlled so as to prevent a collision of data read out of the memory cell arrays from occurring on the data buses, thereby reducing an area for the data buses.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

DETAILED DESCRIPTION OF THE PREFERRED EMBODIMENTS

Figure 6:
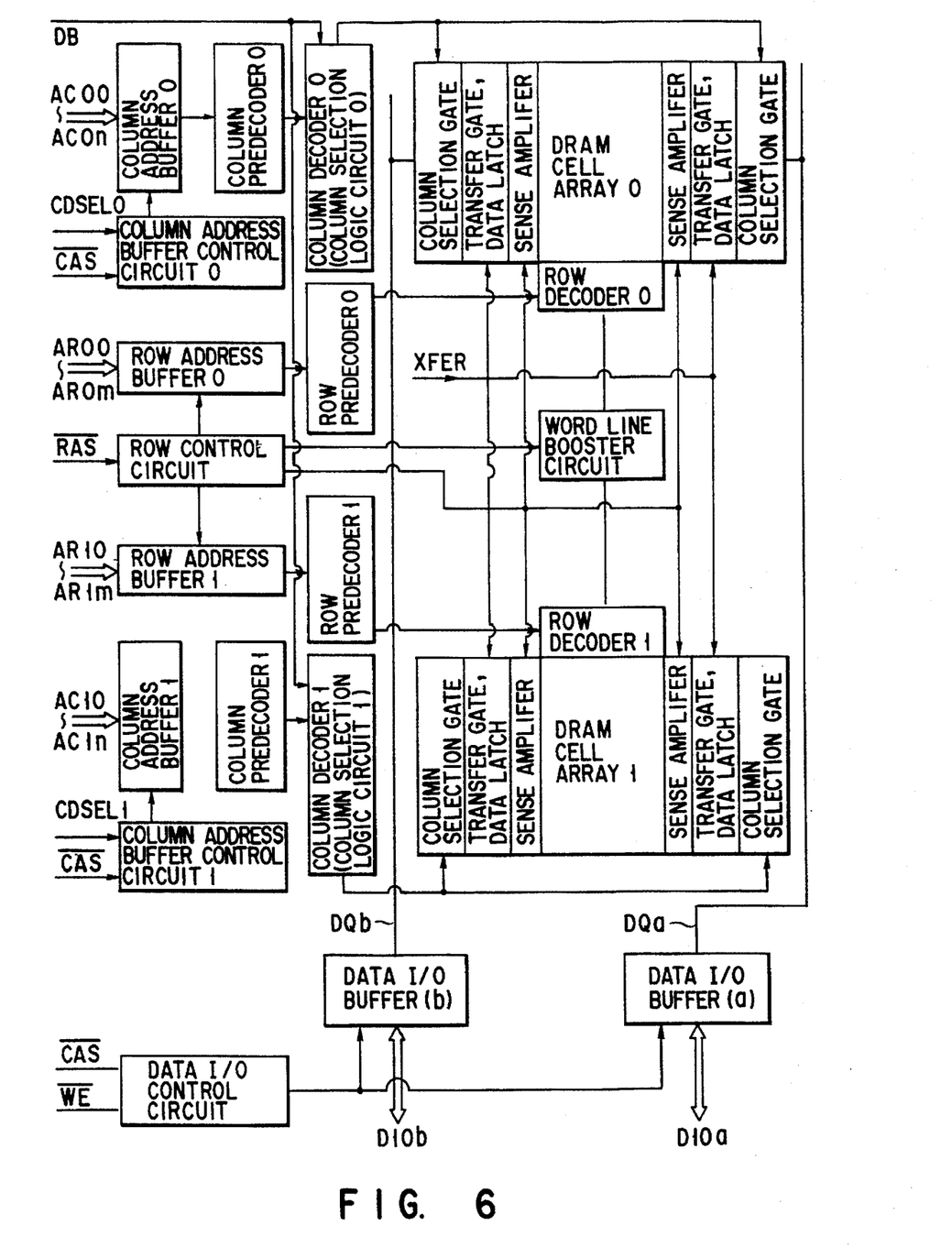
FIG. 6 is a block diagram showing the circuit arrangement of a DRAM having a data latch function according to an embodiment of the present invention.

FIG. 6 is a block diagram showing a memory circuit including a DRAM having a data latch function according to an embodiment of the present invention. This circuit differs from that shown in FIG. 1 in the following point. In the DRAM of FIG. 1, each of the two cell arrays 0 and 1 has its independent data buses, such as the cell array 0 having buses DQa0 and DQb0 and the cell array 1 having buses DQa1 and DQb1, and the final output is obtained from one of DQa0 and DQa1 and one of DQb0 and DQb1 which are selected by the multiplexers. In the DRAM shown in FIG. 6, data buses DQa and DQb are common to two cell arrays. As will be described later, the memory circuit of FIG. 6 is externally supplied with a column selection logic control signal DB, in response to which column selection logic circuits 0 and 1 are controlled.

Figure 7A:
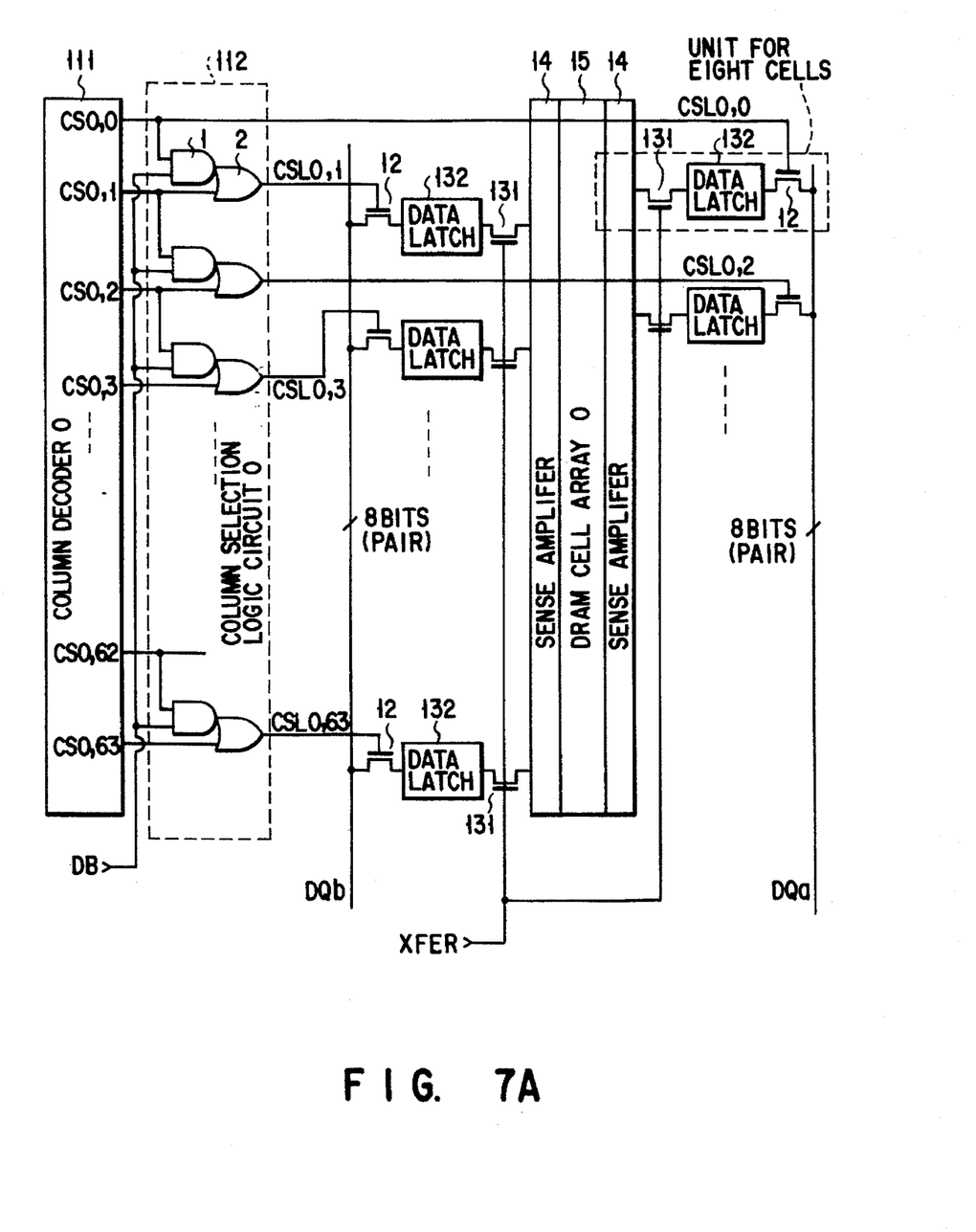
FIG. 7A is a first circuit diagram of the main part of the DRAM shown in FIG. 6.
Figure 7B:
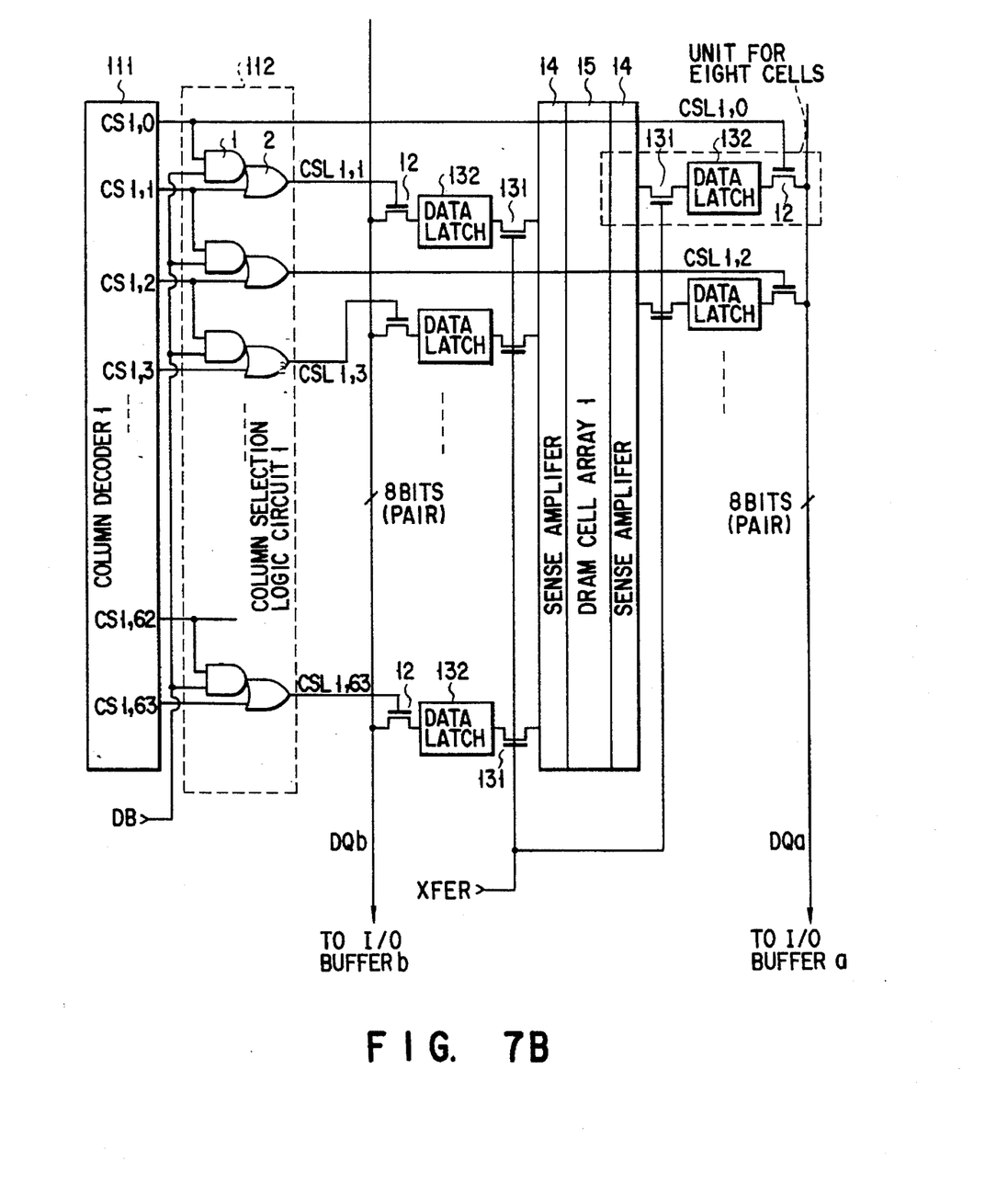
FIG. 7B is a second circuit diagram of the main part of the DRAM shown in FIG. 6.

FIGS. 7A and 7B are circuit diagrams each showing the main part of the memory circuit of FIG. 6 including a column selection gate, a column decoder and a column selection logic circuit. It is in the arrangement of the column selection logic circuit that the circuit of FIG. 6 differs from that of FIG. 1. In the column selection logic circuit 112 shown in FIG. 7A, the output of AND gate 1 is connected to one of inputs of OR gate 2, the signal DB is supplied to one of the inputs of the AND gate 1, and a column decode signal is supplied to the other input of the AND gate 1 from its adjacent column decoder 111. When the input signal DB becomes high in level, the column selection logic circuit 112 performs the same operation as the circuit 412 shown in FIG. 3. When the signal DB becomes low in level, the simultaneous access to adjacent columns is stopped. As for the cell array 0, therefore, data are read out from only one of the data buses DQa and DQb when the signal DB is at a low level. The same is true of the circuit arrangement shown in FIG. 7B.

Figure 8:
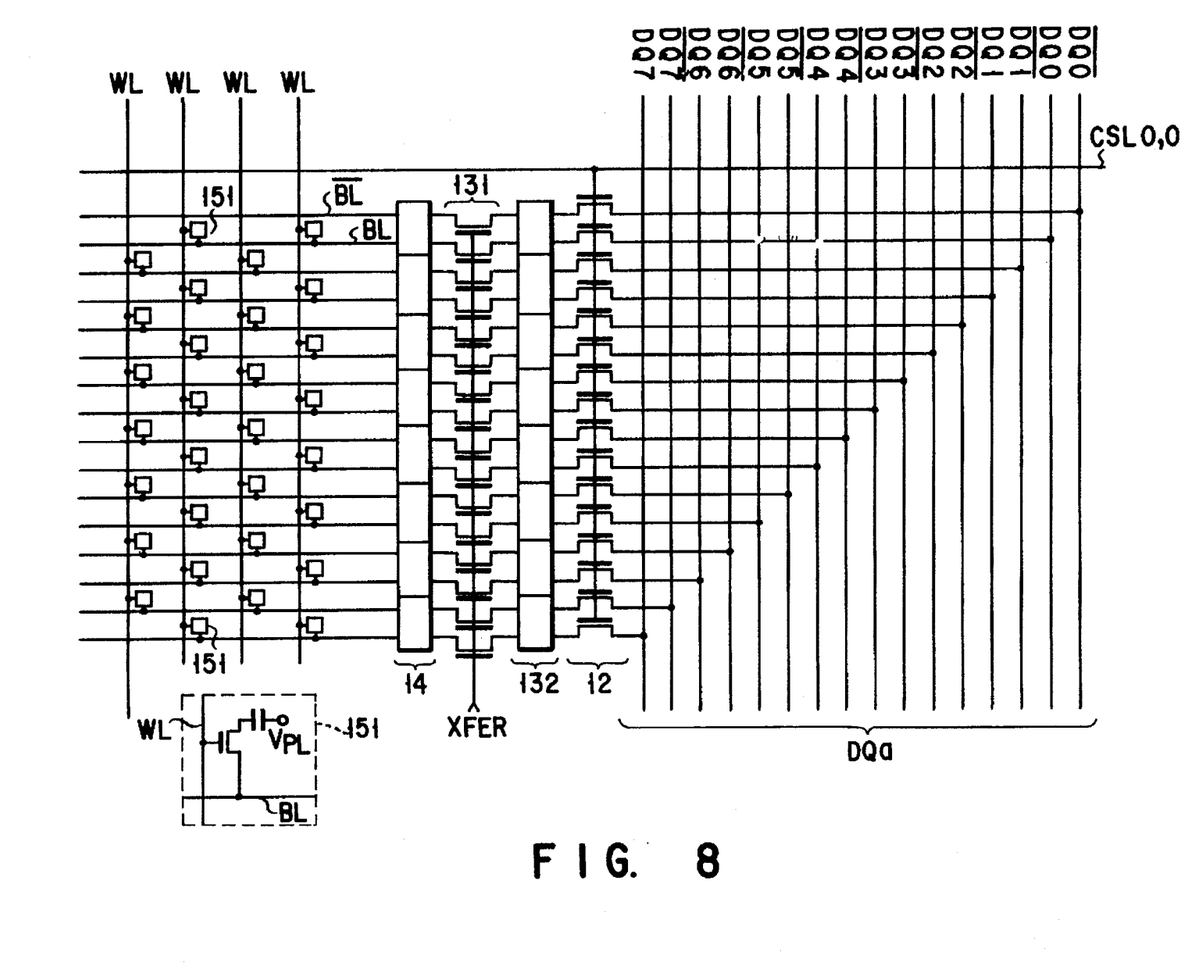
FIG. 8 is a circuit diagram showing in more detail the main parts of the DRAM shown in FIGS. 7A and 7B.

Using the column selection logic circuit 112 having the above arrangement, a data collision can be prevented on the data buses common to the two cell arrays. A sense amplifier 14, a transfer gate 131, a data latch 132 and a column selection gate 12 shown in FIGS. 7A and 7B are the same in constitution as those in FIGS. 3A and 3B. In this embodiment, too, n=5 and thus a 6-bit column address signal is input to the memory circuit shown in FIG. 6. As illustrated in FIG. 8, eight pairs of columns (i.e., sixteen columns) corresponding to eight memory cells 151, correspond to a single column selection signal (e.g., CSL0,0 in FIG. 7A), and these columns are connected to the data buses DQa of 8 bits, respectively. In other words, the transfer gate 131, data latch 132 and column selection gate 12, which are encircled with the broken line in FIG. 7A, constitute a data transmission unit for eight cells, that is, a circuit block corresponding to eight arrangements of FIG. 2. This arrangement is true of FIG. 7B and the eight-pairs of columns (i.e., sixteen columns) are connected to the data buses DQa common to both the cell arrays shown in FIGS. 7A and 7B.

An operation of the DRAM shown in FIG. 6 will now be described, with reference to the timing chart of FIG. 9, on the basis of the conceptual view of the address space shown in FIG. 4. As in the conventional scanning shown in FIG. 4, the uppermost horizontal line from a0,0 to a1,7 is scanned from left to right while accessing two adjacent column addresses simultaneously. From STEP 1 to STEP 7, data is read out of the cell array 0. If, therefore, the levels of signals CDSEL0, CDSEL1 and DB are set high, low and high, respectively, to input the column address signals in sequence only to the AC00 to AC05, the cell array 1 is not activated, with the result that the data buses DQ are always occupied by data of the cell array 0, and the data of the cell array 0 will never collide with that of the cell array 1 on the buses DQ.

It is STEP 8 that we should pay attention to. In STEP 8, data to be accessed, which corresponds to column address a0,7, are read out of the cell array 0, while data corresponding to column address a1,0 is read out of the cell array 1. If both signals CDSEL0 and CDSEL1 are set to a high level with input signal DB set to a high level, and address signals corresponding to the column address a0,7 and the column address a1,0 are set to AC00 to AC05 and AC10 to AC15, respectively, data of a0,8 (unnecessary column data adjacent to that of a0,7) read out of the cell array 0 collides with that of a1,0 read out of the cell array 1 on the bus DQa and thus the data of a1,0 are not correct. Similarly, there occurs a collision between data of a0,7 and that of a1,1 on the bus DQb.

Figure 9:
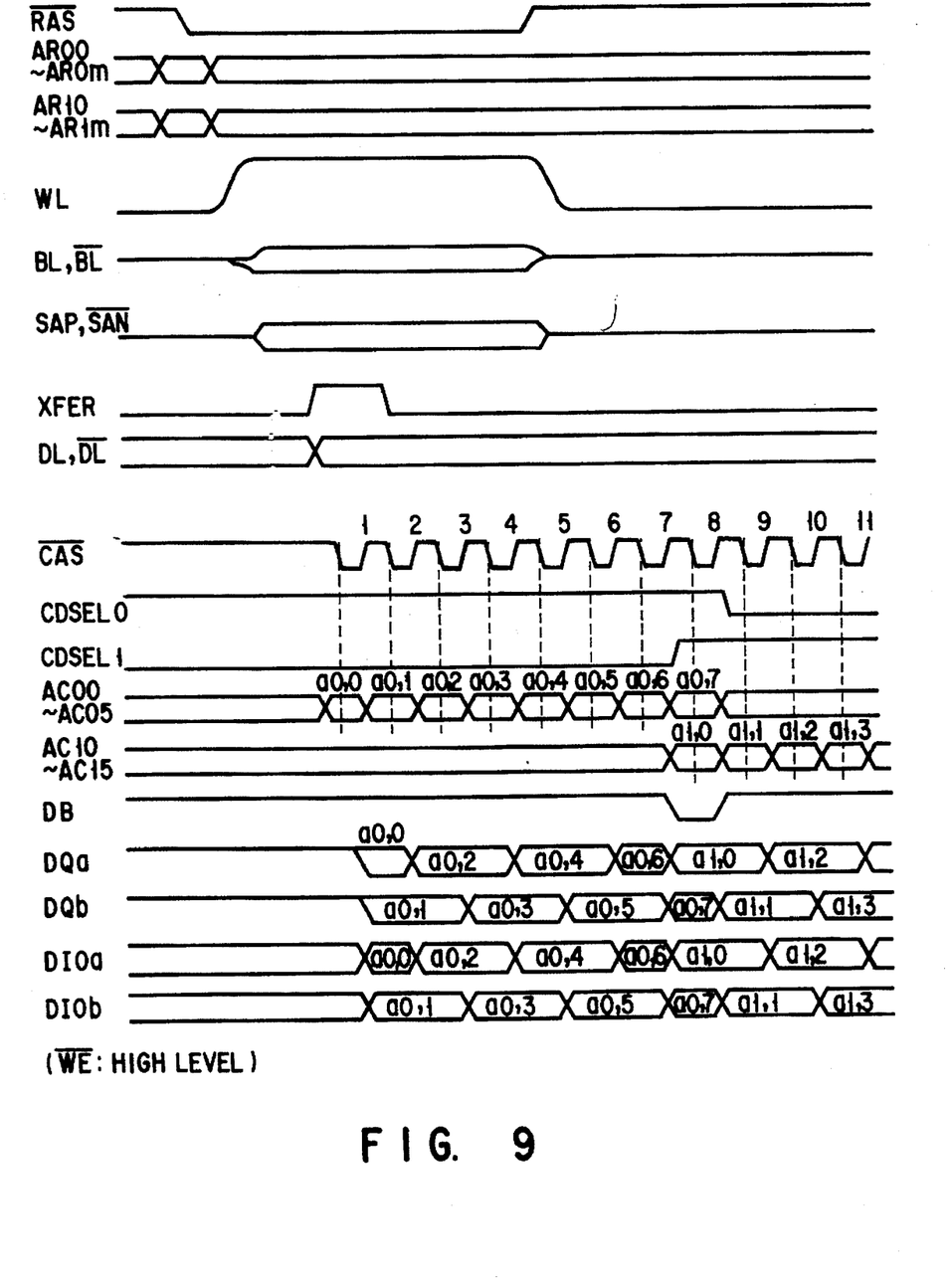
FIG. 9 is a timing chart of the circuit operation of the DRAM shown in FIG. 6.

To avoid the collision, the input column selection logic control signal DB is set to a low level in STEP 8 as shown in FIG. 9, with the result that data of a0,7 is simply output from the cell array 0 to the bus DQb and data of a0,8 is not supplied to the bus DQa. Similarly, data of a1,0 is only output from the cell array 1 to the bus DQa. Consequently, the data collision on the bus DQ can be prevented during which period the two cell arrays are accessed, and data of a0,7 and that of a1,0 can reliably be read out from the buses DQb and DQa, respectively.

From STEP 9 to STEP 15, the access has only to continue while the levels of DB, CDSEL0 and CDSEL1 are set again to high, low and high, respectively. Thus, no data collision occurs since desired data are read out only from the cell array 1.

With the circuit arrangement described above, the area for the buses DQ common to the cell arrays can be decreased without any data collision on the buses. In the above embodiment, the number (L) of memory cells is two, the number (P) of groups into which the columns of each of the memory cells are divided is two in view of data buses DQa and DQb, and the number (Q) of bit lines corresponding to one access in each of the cell arrays is sixteen (eight pairs). The present invention is not limited to these numbers. Needless to say, the more the memory cell arrays, the higher the degree of integration. The larger the number of groups into which the columns of each cell array are divided, the more complicated the control of the multiplexer and the like. In the present invention, however, a data collision can be avoided only by providing the column selection logic circuit without any control of the multiplexer or the like.

As shown in FIG. 8, the more the column data, the more the data buses. The arrangement of buses as shown in FIG. 8 should be applied to the memory circuit shown in FIG. 1, and the required number of buses is 64 (8 pairs for each of DQa0, DQb0, DQa1 and DQab, 8×2×4). In other words, four bus arrangements of FIG. 8 are needed for the circuit of FIG. 1. If, however, the bus arrangement of the present invention is employed, the number of data buses is only 32 (8 pairs for each of DQa and DQb, 8×2×2), which corresponds to two bus arrangements of FIG. 8. Consequently, the area occupied by the data buses within a chip can greatly be reduced.

As described above, according to the present invention, since the columns are selected so as to prevent a data collision, the data buses common to the memory cell arrays can be formed. Therefore, the area occupied by the buses within a memory chip can greatly be decreased and the chip can be reduced in size accordingly.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory circuit comprising:

$L (L \geq 2)$ memory cell arrays each including memory cells of M rows and N columns formed in matrix, said N columns having bit lines and being divided into P groups of columns ($2 \leq P \leq L$);

column selection gates each having a conductive path one end of which is connected to each of the bit lines;

data buses common to said L memory cell arrays, each of said data buses being connected to another end of the conductive path of each of said column selection gates; and column selection means for controlling said column selection gates in such a manner that data is read out of/written to P groups of data buses corresponding to the P groups of columns through said column selection gates corresponding to Q ($1 \leq Q \leq N$) bit lines corresponding to arbitrary memory cells included in the N columns of one of said L memory cell arrays, and for allowing simultaneous access to different ones of said memory cell arrays through each of the P groups of data buses.

2. The circuit according to claim 1, wherein said memory cell arrays include DRAM cell arrays.

3. The circuit according to claim 1, wherein when L=P, said column selection means controls said column selection gates such that data is read out of/written to said L memory cells through the P groups of data buses.

4. The circuit according to claim 1, wherein when L=P, the M rows of said memory cell arrays are selected by inputting different address signals.

5. The circuit according to claim 1, further comprising:

first and second data holding means provided between each of said column selection gates and each of said memory cell arrays; and transfer gate means provided between said first and second data holding means, for controlling transfer of data.

6. The circuit according to claim 1, wherein said column selection means includes a logic circuit for outputting a first logic signal to simultaneously connect bit lines corresponding to adjacent columns of the P groups of columns in one of the L memory cell arrays to different data buses and a second logic signal to connect bit lines corresponding to a predetermined group of columns in said one of the L memory cell arrays to the data buses, and said second logic signal is also output to simultaneously connect bit lines corresponding to a predetermined group of columns in another one of the L memory cell arrays to other data buses.

7. The circuit according to claim 6, wherein control of said column selection means is performed by changing a logic level in response to an eternally supplied signal thereby to prevent data of the data buses common to said L memory cell arrays from colliding with each other.

8. A semiconductor memory circuit comprising:

$L (L \geq 2)$ memory cell arrays each including memory cells of M rows and N columns formed in matrix, said N columns having bit lines and being divided into P groups of columns ($2 \leq P \leq L$);

column selection gates each having a conductive path one end of which is connected to each of the bit lines;

first and second data holding means provided between each of said column selection gates and each of said columns of said memory cell arrays;

transfer gate means provided between said first and second data holding means, for controlling transfer of data;

data buses common to same columns of said L memory cell arrays, each of said data buses being connected to another end of the conductive path of each of said column selection gates; and column selection means for controlling said column selection gates in such a manner that data are read out of/written to P groups of data buses corresponding to the P groups of columns through said column selection gates corresponding to Q ($1 \leq Q \leq N$) columns corresponding to arbitrary memory cells included in the N columns of one of said L memory cell arrays, and for allowing simultaneous access to different ones of said memory cell arrays through each of the P groups of data buses.

9. The circuit according to claim 8, wherein said column selection means includes a logic circuit for outputting a first logic signal to simultaneously connect adjacent columns of the P groups of columns of said second data holding means in one of the L memory cell arrays to different data buses and a second logic signal to connect a predetermined group of columns of said second data holding means in said one of the L memory cell arrays to the data buses, and said second logic signal is also output to simultaneously connect another predetermined group of columns of said second data holding means in another one of the L memory cell arrays to other data buses.

10. The circuit according to claim 9, wherein control of said column selection means is performed by changing a logic level in response to an externally supplied signal thereby to prevent data of the data buses common to said L memory cell arrays from colliding with each other.

11. A semiconductor memory circuit comprising:

a plurality of (L) memory cell arrays each including memory cells of M rows and N columns formed in matrix;

first and second data holding means provided for latching data of each of said columns, said first data holding means being connected to each of said columns of said memory cell arrays;

column selection gates each having a conductive path one end of which is connected to each of said second data holding means;

transfer gates provided between each of said first and second data holding means, for controlling transfer of data between said first and second data holding means;

data buses common to same columns of said plurality of memory cell arrays, each of said data buses being connected to another end of the conductive path of each of said column selection gates; and column selection means for controlling said column selection gates in such a manner that data are read out of/written to data bus groups, obtained by dividing said data buses, through said column selection gates corresponding to predetermined columns corresponding to memory cells connected to arbitrary rows in the data bus groups of one of said plurality of memory cell arrays, and for allowing simultaneous access to different ones of said memory cell arrays through each of the data bus groups.

12. The circuit according to claim 11, wherein said memory cell arrays include DRAM cell arrays.

13. The circuit according to claim 11, wherein said column selection means includes a logic circuit for outputting a first logic signal to simultaneously connect different ones of columns of said second data holding means of the plurality of memory cell arrays to the different ones of the data bus groups respectively and a second logic signal to connect a predetermined one of the data bus groups to said second data holding means of one of the plurality of memory cell arrays, and said second logic signal is also output to simultaneously connect another one of the data bus groups to said second data holding means of another one of the plurality of memory cell arrays.

14. The circuit according to claim 13, wherein said column selection means allows columns corresponding to adjacent column addresses to be simultaneously connected to different ones of the data bus groups in response to the first logic signal.

15. The circuit according to claim 13, wherein control of said column selection means is performed by changing a logic level in response to an externally supplied signal thereby to prevent data of the data buses common to said plurality of memory cell arrays from colliding with each other.

16. A semiconductor memory circuit comprising:

a plurality of memory cells arrays having memory cells arranged in columns and rows, said columns having bit lines;

a plurality of data buses connected in common with said memory cell arrays;

a plurality of column selection gates, each having a first terminal coupled to one of the bit lines and a second terminal coupled to one of said data buses;

column selection circuitry, coupled to said column selection gates, for controlling data transfer between said data buses and said bit lines and for allowing simultaneous access to different ones of said memory cell arrays through said data buses.

* * * * *